United States Patent
Perrin et al.

(10) Patent No.: US 7,405,683 B1
(45) Date of Patent: Jul. 29, 2008

(54) EXTENDING THE DYNAMIC RANGE IN AN ENERGY MEASUREMENT DEVICE

(75) Inventors: Jon Keith Perrin, Redmond, WA (US); Kevin Summers, Stanwood, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 15 days.

(21) Appl. No.: 11/139,346

(22) Filed: May 27, 2005

Related U.S. Application Data

(60) Provisional application No. 60/583,229, filed on Jun. 24, 2004, provisional application No. 60/575,205, filed on May 27, 2004.

(51) Int. Cl.
    *H03M 1/00* (2006.01)
(52) U.S. Cl. .................. 341/139; 708/300; 702/142
(58) Field of Classification Search .................. 341/139, 341/155; 455/419; 708/300; 702/142
    See application file for complete search history.

(56) References Cited

U.S. PATENT DOCUMENTS

| | | | |
|---|---|---|---|
| 4,884,021 A | 11/1989 | Hammond et al. | 324/142 |
| 6,115,726 A * | 9/2000 | Ignjatovic | 708/300 |
| 6,167,258 A * | 12/2000 | Schmidt et al. | 455/419 |
| 6,529,850 B2 * | 3/2003 | Wilborn et al. | 702/142 |
| 7,085,328 B2 | 8/2006 | Lin et al. | 375/261 |
| 7,099,641 B2 | 8/2006 | Bruckmann et al. | 455/232.1 |
| 2002/0196717 A1 | 12/2002 | Masui et al. | 369/44.29 |
| 2003/0157910 A1 | 8/2003 | Bruckmann et al. | 455/130 |
| 2006/0084402 A1 | 4/2006 | Oshima et al. | 455/232.1 |

\* cited by examiner

*Primary Examiner*—Jean Bruner Jeanglaude

(57) ABSTRACT

An apparatus for measuring energy usage. The apparatus can include an amplifier having a plurality of gain stages and the amplifier can be for receiving an input signal. The apparatus can also include an analog-to-digital converter that is coupled to the amplifier. Furthermore, the apparatus can include a scaling adjustment module that is coupled to the analog-to-digital converter. Additionally, the apparatus can include a gain control module coupled to the analog-to-digital converter.

20 Claims, 4 Drawing Sheets

EXTENDING THE DYNAMIC RANGE IN AN ENERGY MEASUREMENT DEVICE

CROSS REFERENCE TO RELATED APPLICATIONS

This patent application claims benefit of: co-pending U.S. Provisional Patent Application No. 60/575,205 entitled "A Method For Extending The Dynamic Range In A Energy Device Using An 8-Bit Sampling A/D" by Jon Perrin et al., filed on May 27, 2004; and co-pending U.S. Provisional Patent Application No. 60/583,229 entitled "A Method For Extending The Dynamic Range In A Energy Device Using An 8-Bit Sampling Analog To Digital Converter (ADC)" by Jon Perrin et al., filed on Jun. 24, 2004, which were both assigned to the assignee of the present application and are both hereby incorporated by reference.

BACKGROUND

Electrical power meters (EPMs) are widely used in residences and businesses to measure power consumption. Electrical power meters are also known as watt-hour meters. Countries such as India, China, Turkey and other populous countries that are quickly industrializing desire many EPMs to connect to the newly developing power grids. Additionally, other more industrialized countries are moving from mechanical power measuring devices to electronic devices in order to measure power more effectively.

Due to the large number of power meters being installed, this market has become very cost conscious, so much so that the power meters have basically become a "commodity". In particular, in developing countries, cost is a major factor in the decision to choose a power meter. As such, it is very desirable to make the power meter as inexpensive as possible.

Conventional power meters may need to support a range of current loads from 10 amperes (A) to over 200 A depending upon the accuracy requirement. Conventional power meters generally utilize a dedicated 12-bit, 14-bit or 16-bit analog-to-digital converter (ADC). Additionally, some conventional power meters use multiplexing to measure more than one channel of data. The processing operations typically required to produce the energy measurement are generally performed using a 16-bit processor or digital signal processor (DSP), or a custom application-specific integrated circuit (ASIC).

One of the disadvantages of using a 12-bit, 14-bit or 16-bit ADC is that it typically involves utilizing a high bandwidth processor or DSP in order to manage the sampling rate, which adds additional cost in making the conventional power meter. Furthermore, utilizing a 12-bit, 14-bit or 16-bit ADC can increase the conventional power meter fabrication costs. It is noted that if a custom ASIC is utilized, another microprocessor is typically needed to provide energy management and communication features, thereby adding cost and complexity to the conventional power meter. Moreover, conventional power meters are usually not dynamically scalable.

The invention may address one or more of the above issues.

SUMMARY

One embodiment in accordance with the invention is an apparatus for measuring energy usage. The apparatus can include an amplifier having a plurality of gain stages and the amplifier can be for receiving an input signal. The apparatus can also include an analog-to-digital converter that is coupled to the amplifier. Furthermore, the apparatus can include a scaling adjustment module that is coupled to the analog-to-digital converter. Additionally, the apparatus can include a gain control module coupled to the analog-to-digital converter.

While a particular embodiment of the invention has been specifically described within this summary, it is noted that the invention is not limited to this embodiment. The invention is intended to cover alternatives, modifications and equivalents which may be included within the scope of the invention as construed by the Claims.

DETAILED DESCRIPTION

Reference will now be made in detail to embodiments in accordance with the invention, examples of which are illustrated in the accompanying drawings. While the invention will be described in conjunction with embodiments, it will be understood that these embodiments are not intended to limit the invention. On the contrary, the invention is intended to cover alternatives, modifications and equivalents, which may be included within the scope of the invention as construed according to the Claims. Furthermore, in the following detailed description of embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
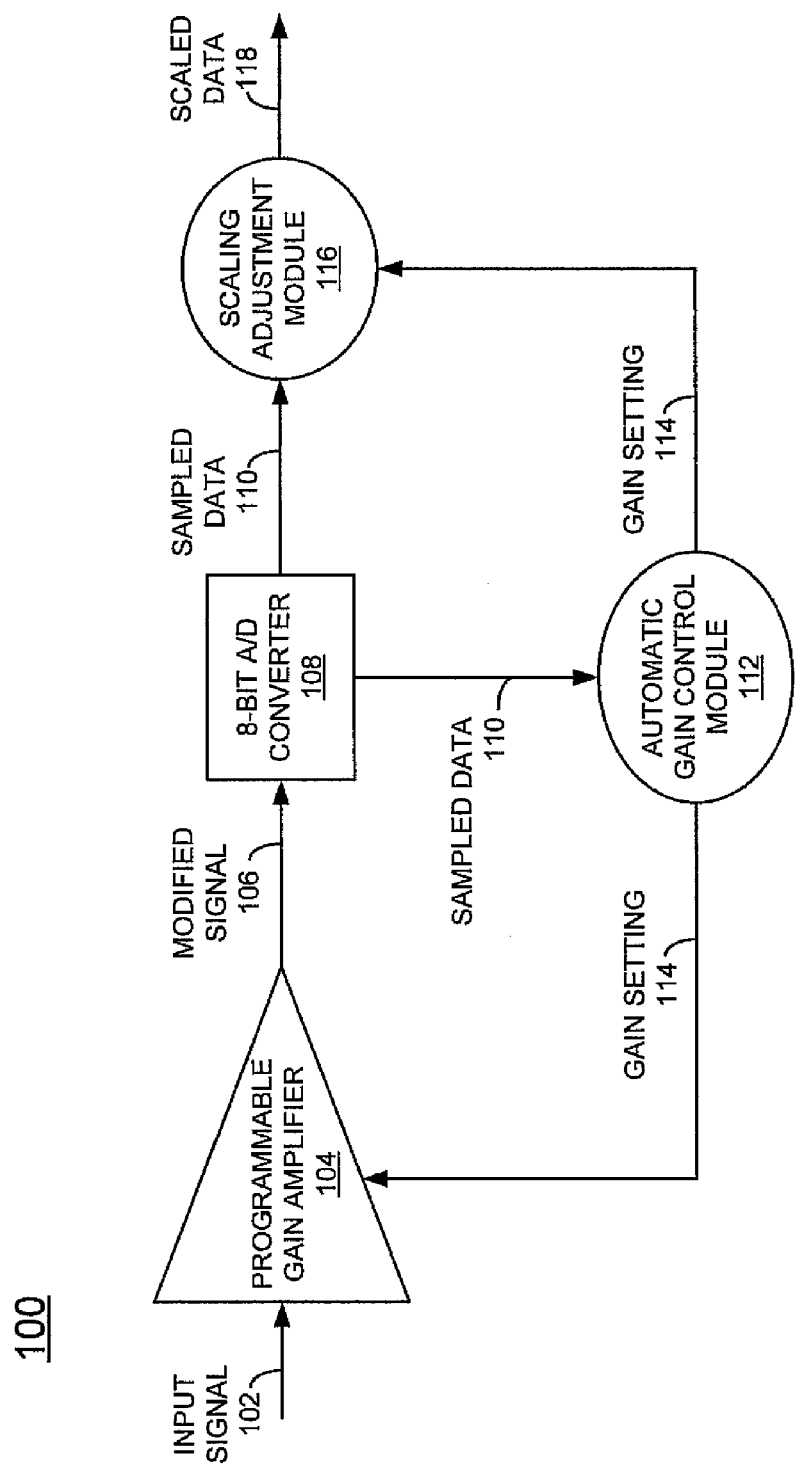
FIG. 1 is a block diagram of an exemplary energy measurement device in accordance with embodiments of the invention.

FIG. 1 is a block diagram of an exemplary energy measurement device or apparatus 100 in accordance with embodiments of the invention. Specifically, energy measurement apparatus 100 can extend the effective dynamic range of an energy measurement by utilizing an 8-bit analog-to-digital (A/D) converter 108 in combination with a programmable gain amplifier 104 having a multiple (or a plurality) of gain and/or attenuation settings. Note that in order to maximize the dynamic range of energy measurement apparatus 100, the programmable gain amplifier 104 can be utilized to amplify and/or attenuate input signal 102, thereby generating a modified signal 106 that can be output to the A/D converter 108. It is understood that an automatic gain control module 112 can automatically adjust the gain of the programmable gain amplifier 104 to the appropriate level for input signal 102. For example, if automatic gain control module 112 determines that the amplitude of input signal 102 is too small for A/D converter 108, control module 112 can adjust the gain of amplifier 104 to increase the effective resolution of A/D converter 108. Note that energy measurement apparatus 100 can be utilized for any type of energy metering application, but is not limited to such. Additionally, energy measurement apparatus 100 can be utilized for measuring voltage and/or current.

Energy measurement apparatus 100 can include programmable gain amplifier circuit 104, 8-bit analog-to-digital converter (ADC) 108, a scaling adjustment module 116, and automatic gain control module 112. The programmable gain amplifier 104 can have a plurality of gain stages and can change its gain setting on-the-fly. It is understood that programmable gain amplifier 104 can be implemented with any number of gain stages having a variety of gain and/or attenuation settings thereby enabling the 8-bit ADC 108 to cover a dynamic range of measurements. For example, in one embodiment in accordance with the invention, programmable gain amplifier 104 has, but is not limited to, seven discrete "gain" settings or stages wherein the gain settings are x0.5, x1, x2, x4, x8, x16, and x24. Note that these seven discrete gain settings can increase the dynamic range of measurements of energy measurement apparatus 100 by a factor of 48 over what the 8-bit ADC 108 is capable of alone. In another embodiment in accordance with the invention, programmable gain amplifier 104 has, but is not limited to, nine discrete "gain" settings or stages wherein the gain settings are x0.5, x1, x2, x4, x8, x16, x24, x32, and x48.

Within FIG. 1, gain control module 112 can enable programmable gain amplifier 104 to transition from one gain stage setting to the next gain stage setting as smoothly as possible such that glitching is minimized, clipping is prevented, and constant gain switching is avoided near gain transition points. Specifically, glitching can be prevented by control module 112 by switching gain setting 114 at opportune times during the sampling period of ADC 108. Furthermore, clipping can be prevented by control module 112 by monitoring the maximum and minimum sample peaks during the cycle period. Moreover, constant gain switching can be prevented by control module 112 by utilizing a hysteresis type technique for determining when to increase or decrease setting 114 in magnitude.

Energy measurement apparatus 100 can operate in the following manner. Note that before measurement apparatus 100 receives input signal 102, control module 112 can initially output to programmable gain amplifier 104 an initial gain setting value 114 to establish or set the gain, attenuation, or unity value that will be first used by programmable gain amplifier 104 on input signal 102. Input electrical signal 102 can then be received from a voltage source (not shown) and then can be amplified, attenuated, or multiplied by a unity gain value of 1 by programmable gain amplifier 104 thereby resulting in modified signal 106. Note that one of the advantages of implementing programmable gain amplifier 104 as an analog device in one embodiment is that it can operate in real time without utilizing any processor cycles. Next, the programmable gain amplifier 104 can then transmit or output modified signal 106 to 8-bit ADC 108, which samples modified signal 106 for a specific time period at a particular frequency (e.g., approximately 3.2 KHz) thereby producing sampling data 110 corresponding with the sampling period of modified signal 106. Subsequently, the 8-bit ADC 108 can output the sampled data 110 to both the scaling adjustment module 116 and the automatic gain control module 112.

Note that ADC 108 of FIG. 1 can operate in a wide variety of ways. For example, ADC 108 can perform oversampling or dithering to the modified signal 106 in order to improve the accuracy of its sampling and also improve its bulk common mode rejection ability. It is appreciated that the sampling rate of ADC 108 can be associated with the frequency of the AC (alternating current) electrical power that may be measured by apparatus 100. For instance, given that AC electrical power has a frequency of 60 Hz (Hertz) in the United States of America, in one embodiment, the ADC 108 can sample modified signal 106 for a whole cycle and take 64 measurements of its voltage and current and calculate them digitally. As such, ADC 108 can detect maximum and minimum values for each cycle. Next, for each of the 64 sets of voltage and current measurements, ADC 108 can multiple each set together and then sum the resulting instantaneous power (which can be stored in one or more digital registers). The resulting instantaneous power along with the maximum and minimum values (or peak-to-peak values) can be part of sampled data 110.

It is understood that each gain stage and/or attenuation stage of programmable gain amplifier 104 can have offset and gain error associated with it. Furthermore, ADC 108 can also have offset and gain error associated with it. As such, a calibration methodology can be implemented as part of energy measurement apparatus 100. For example, in one embodiment in accordance with the invention, as part of a production process for energy measurement apparatus 100, the offset and gain error can be measured or determined for each gain stage and/or attenuation stage of programmable gain amplifier 104 and for the ADC 108. As such, in one embodiment in accordance with the invention, any measured offset and/or gain error can be compensated for by individually adjusting the gains within each of the gain amplifier 104 and the ADC 108 when energy measurement apparatus 100 is initially booted up. Alternatively, any measured offset and/or gain error can be compensated for by adjusting the gains on the energy measurement apparatus 100 as a whole when it is initially booted up.

Within FIG. 1, the automatic gain control module 112 can monitor the sampled data 110 to determine if one or more of its values has reached an upper or lower threshold level for maintaining a desired accuracy of 8-bit ADC 108. If so, automatic gain control module 112 can control the selection of the value of gain setting 114. For example, in one embodiment, if the difference between the peak-to-peak values of the sampled data 110 of FIG. 1 reaches an upper threshold level, then the automatic gain control module 112 can adjusted gain setting 114 by lowering or decreasing its value, which can then be transmitted to the programmable gain amplifier 104. Conversely, if the difference between the peak-to-peak values of the sampled data 110 reaches the lower threshold level, then the automatic gain control module 112 can adjusted gain setting 114 by raising or increasing its value, which can be transmitted to the programmable gain amplifier 104. However, if the difference between the peak-to-peak values of the sampled data 110 is situated somewhere between the upper and lower threshold levels, then the automatic gain control module 112 can leave the value of gain setting 114 unchanged. In this manner, there can be an allowable value range for ADC 108, thereby automatic gain control module 112 implements hysteresis allowing for smooth transitions between gain, unity, and/or attenuation stages of the programmable gain amplifier 104 and enabling 8-bit ADC 108 to maintain a desirable level of accuracy. Understand that the gain setting 114 for programmable gain amplifier 104 may be adjusted by control module 112 before ADC 108 initiates the next sampling of modified signal 106.

In one embodiment in accordance with the invention, the ADC 108 may be implemented such that it measures a voltage that is directly proportional to a current. Therefore, if modified signal 106 is a current signal, it can be converted into a voltage signal thereby enabling the ADC 108 to properly sample modified signal 106. As such, when the voltage of modified signal 106 increases, that represents current increasing.

Table 1 shown below is an exemplary implementation of upper and lower transition of threshold points for automatic gain control module 112, wherein the highest current level, in one embodiment, can be represented by a 5 volt peak-to-peak ($V_{p-p}$) signal.

TABLE 1

| $V_{Current}$ Upper Limit | $V_{Current}$ Lower Limit | Gain Setting |
|---|---|---|
| 4.6 $V_{p-p}$* | 1.93 $V_{p-p}$ | 0.5 |
| 2.03 $V_{p-p}$ | 0.97 $V_{p-p}$ | 1 |
| 1.02 $V_{p-p}$ | 0.48 $V_{p-p}$ | 2 |
| 0.51 $V_{p-p}$ | 0.24 $V_{p-p}$ | 4 |
| 0.25 $V_{p-p}$ | 0.12 $V_{p-p}$ | 8 |
| 0.13 $V_{p-p}$ | 0.06 $V_{p-p}$ | 16 |
| 0.09 $V_{p-p}$ | 0.00 $V_{p-p}$ | 24 |

Note that automatic control module 112 can have hysteresis designed in to avoid oscillations of the gain setting value 114 at the boundaries between different gain ranges. Specifically, Table 1 includes two columns for each of the seven exemplary gain settings shown. The first column lists the upper limit for the current sense voltage ($V_{Current}$) of sampled data 110, where the gain setting can be decreased. The second column lists the lower limit for the current sense voltage of sampled data 110 (where the gain setting can be increased). For example, if the sampled data 110 indicates that the modified signal 106 exceeds the value of 0.51 $V_{p-p}$, the automatic gain control module 112 switches the gain setting 114 from a gain of 4 to a gain of 2. However, if the sampled data 110 indicates that the modified signal 106 has decreased below the value of 0.48 $V_{p-p}$, the automatic gain control module 112 switches the gain setting 114 from a gain of 2 to a gain of 4. Note that the asterisk (*) of Table 1 indicates that the maximum input voltage for energy measurement apparatus 100 is limited by its supply voltage ($V_{DD}$).

Within FIG. 1, note that the automatic gain control module 112 can send or transmit the gain setting 114 to scaling adjustment module 116 that corresponds with the value used for the sampled data 110 received by scaling module 116. Alternatively, scaling adjustment module 116 can request and receive the gain setting 114 from automatic gain control module 112 for each new sampling of modified signal 106. The scaling adjustment module 116 can utilize the sampled data 110 and the gain setting 114 in order to scale the sampled data 110 into scaled data 118, which corresponds to a real-world measured value associated with input signal 102. For example, the scaling adjustment module 116 can divide the sampled data 110 by the corresponding gain setting 114 that was utilized by the programmable gain amplifier 102 on input signal 102 to produce a specific sample of modified signal 106. For instance, if the gain setting 114 was set at x2 when the programmable gain amplifier 104 produced a specific sample of modified signal 106, the scaling adjustment module 116 can divide the sampled data 110 by the gain value of 2 in order to remove the amplification value from the measured value of the sample of modified signal 106. Once the scaled data 118 is generated, scaling adjustment module 116 can output scaled data 118 to a power calculation algorithm (not shown) that can determine the amount of measured power associated with scaled data 118.

The automatic gain control module 112, the scaling adjustment module 116, the 8-bit ADC 108, and the programmable gain amplifier 104 can each be implemented with software, with firmware, with electronic hardware, or with any combination thereof.

It is noted energy measurement device 100 has a dynamic range of measurements that a conventional 8-bit A/D converter does not exhibit. For example, a 20 ampere (A) rated meter with a 3× maximum current rating results in a resolution of 234 milliamperes peak-to-peak ($mA_{P-P}$) per LSb (least significant bit) for a conventional 8-bit A/D converter. A minimum specification of 234 $mA_{P-P}$ will not typically meet the requirements of a power meter. It is understood that $V_i$ (current sense voltage) is a measured voltage signal that is directly proportional to the current that measurement device 100 can be designed to measure. Therefore, for small $V_i$ signals, the gain of programmable gain amplifier 104 can be adjusted which can increase the effective resolution of energy measurement device 100. For example, for the smallest current measurements, the programmable gain amplifier 104 can be dynamically adjusted to a gain value of 24 for the gain setting 114, thereby increasing the effective resolution of the ADC 108 to 9.8 $mA_{P-P}$ per LSb which is a desirable value.

There are several advantages associated with the energy measurement apparatus 100 of FIG. 1. For example, the energy measurement apparatus 100 can enable an effective sampling precision of, but not limited to, 14 bits using the 8-bit ADC 108, and it enables quick computations using a small and inexpensive 8-bit processor (not shown). Understand that energy measurement apparatus 100 can enable an effective sampling precision of N-bits using the 8-bit ADC 108, wherein N is greater than the value of 8. Furthermore, the energy measurement apparatus 100 can enable an efficient energy measurement technique having a low bandwidth which is due to the native size of the 8-bit data value. A further advantage is that the scaling performed by the scaling adjustment module 116 can enable direct one-to-one correlation to real-world measurements. The automatic gain control module 112 using hysteresis allows for smooth transitions between gain stages 114, and the pre-processing and post-processing of data can be more easily performed due to, in one embodiment, the combination of both hardware and software components within energy measurement apparatus 100. It is appreciated that by computing with 8-bit data on an inexpensive microprocessor (not shown), it can reduce the amount of data storage used by measurement apparatus 100 and can also reduce the size of a software program used by apparatus 100. This can also effectively increase the speed at which energy measurement apparatus 100 can operate. The energy measurement apparatus 100 also enables double-correlated sampling within the 8-bit ADC 108. Understand that the use of double correlated sampling can increase common mode rejection, especially for slow signals induced by 1/F noise, where F is equal to the AC frequency (e.g., 60 Hz) of input signal 102.

Within FIG. 1, programmable gain amplifier 104 can be coupled to receive input signal 102 from a power source (not shown). Additionally, programmable gain amplifier 104 can be coupled to receive gain setting 114 that can be output by automatic gain control module 112. The output of programmable gain amplifier 104 can be coupled to an input of A/D converter 108. The scaling adjustment module 116 and the automatic gain control module 112 can be coupled to receive the sampled data 110 output by the A/D converter 108. The scaling adjustment module 116 can be coupled to also receive gain setting 114 output by automatic gain control module 112. An output of scaling adjustment module 116 can be coupled to an input of a power calculation module (not shown).

Note that the A/D converter 108 of energy measurement apparatus 100 can be implemented in a wide variety of ways and is not limited to an 8-bit configuration. For example, in one embodiment in accordance with the invention, the A/D converter 108 can be implemented with any bit number configuration. It is understood that the programmable gain amplifier 104 can include gain settings, a unity gain setting, attenuation settings, or any combination thereof. As such, gain setting 114 can include gain settings, a unity gain setting, attenuation settings, or any combination thereof. It is understood that the programmable gain amplifier 104 is not limited to be implemented as a programmable gain amplifier. For example, in one embodiment in accordance with the invention, the programmable gain amplifier 104 can be implemented as a programmable attenuator having a plurality of attenuation stages.

Figure 2:
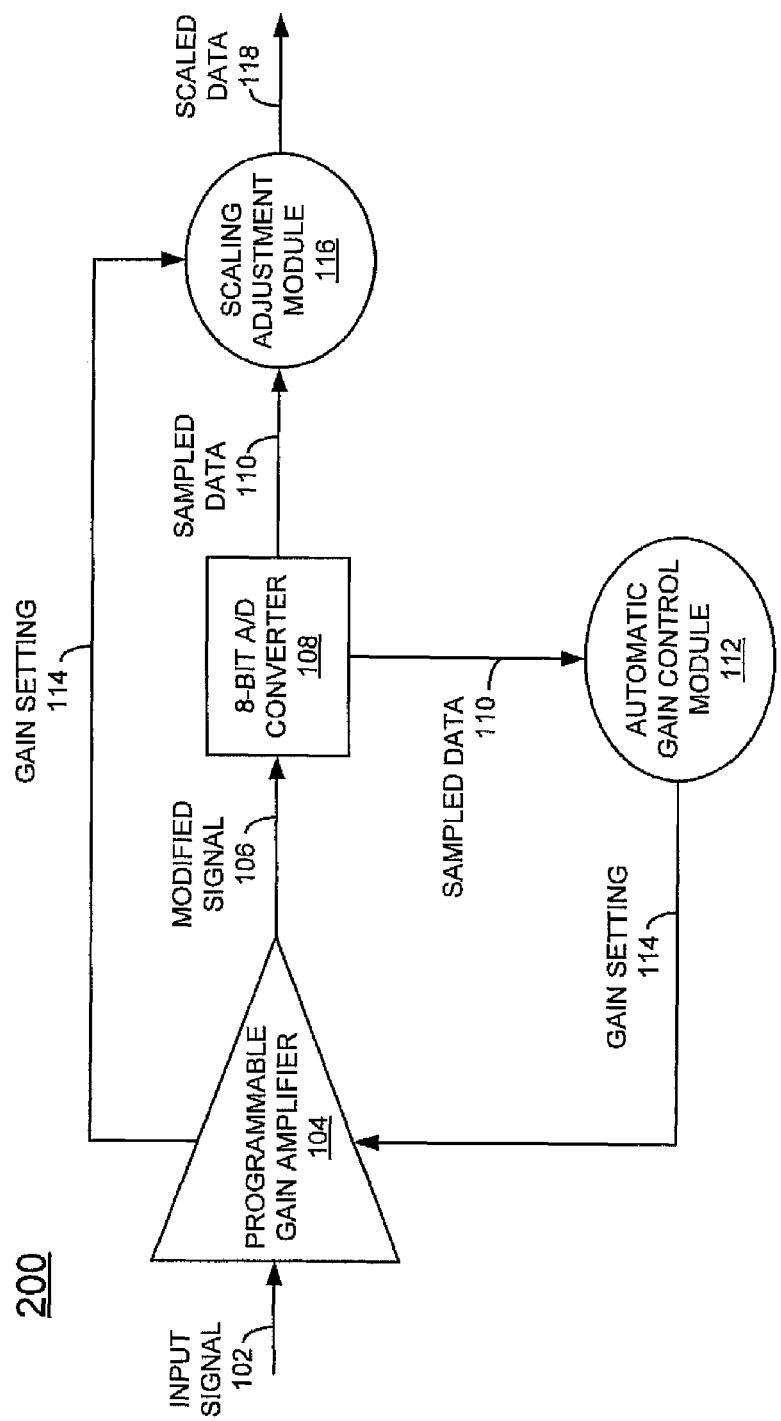
FIG. 2 is a block diagram of another exemplary energy measurement device in accordance with embodiments of the invention.

FIG. 2 is a block diagram of an exemplary energy measurement device or apparatus 200 in accordance with embodiments of the invention. It is understood that energy measurement apparatus 200 can operate in any manner similar to energy measurement apparatus 100 of FIG. 1, described herein. However, the scaling adjustment module 116 of energy measurement apparatus 200 of FIG. 2 can receive gain setting 114 from the programmable gain amplifier 104. For example, in one embodiment in accordance with the invention, the scaling adjustment module 116 can request and receive the gain setting 114 from the programmable gain amplifier 104 for each sampling period of modified signal 106. Alternatively, in another embodiment, the programmable gain amplifier 104 can output gain setting 114 to the scaling adjustment module 116 for each sampling period of modified signal 106. Note that gain setting 114 can be originally received by the programmable gain amplifier 104 from the automatic gain control module 112 in any manner similar to that described herein, but is not limited to such.

Within FIG. 2, programmable gain amplifier 104 can be coupled to receive input signal 102 from a power source (not shown). Additionally, programmable gain amplifier 104 can be coupled to receive gain setting 114 that can be output by automatic gain control module 112. A first output of programmable gain amplifier 104 can be coupled to an input of A/D converter 108. The scaling adjustment module 116 can be coupled to receive gain setting 114 output by programmable gain amplifier 104. The scaling adjustment module 116 and the automatic gain control module 112 can be coupled to receive the sampled data 110 output by the A/D converter 108. An output of scaling adjustment module 116 can be coupled to an input of a power calculation module (not shown).

Figure 3:
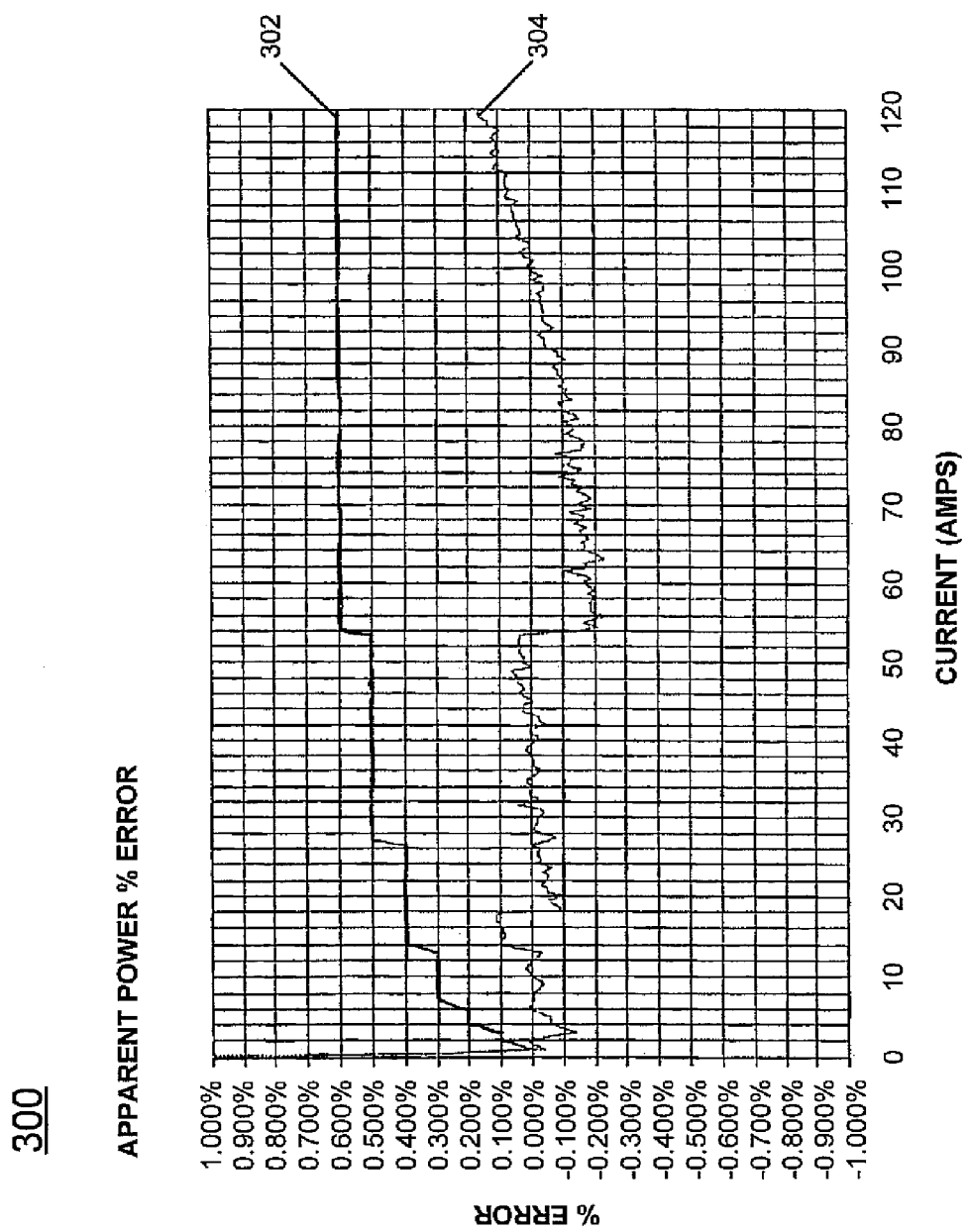
FIG. 3 is a graph of an exemplary plot in accordance with embodiments of the invention.

FIG. 3 is a graph 300 of an exemplary plot in accordance with embodiments of the invention. Specifically, graph 300 includes a line 304 which indicates the absolute power percentage error of one embodiment of an energy measurement device (e.g., 100) in accordance with the invention while a current load was changed from 0 A to 120 A. Additionally, graph 300 includes a line 302 indicating where a gain setting (e.g., 114) of a programmable gain amplifier (e.g., 104) was changed by an automatic gain control module (e.g., 112) as the current load changed from 0 A to 120 A. Note that the exemplary energy measurement device (or power meter) in accordance with the invention that was associated with generating graph 300 had an absolute error percentage of +/−0.25%, thereby indicating an accurate power meter.

Figure 4:
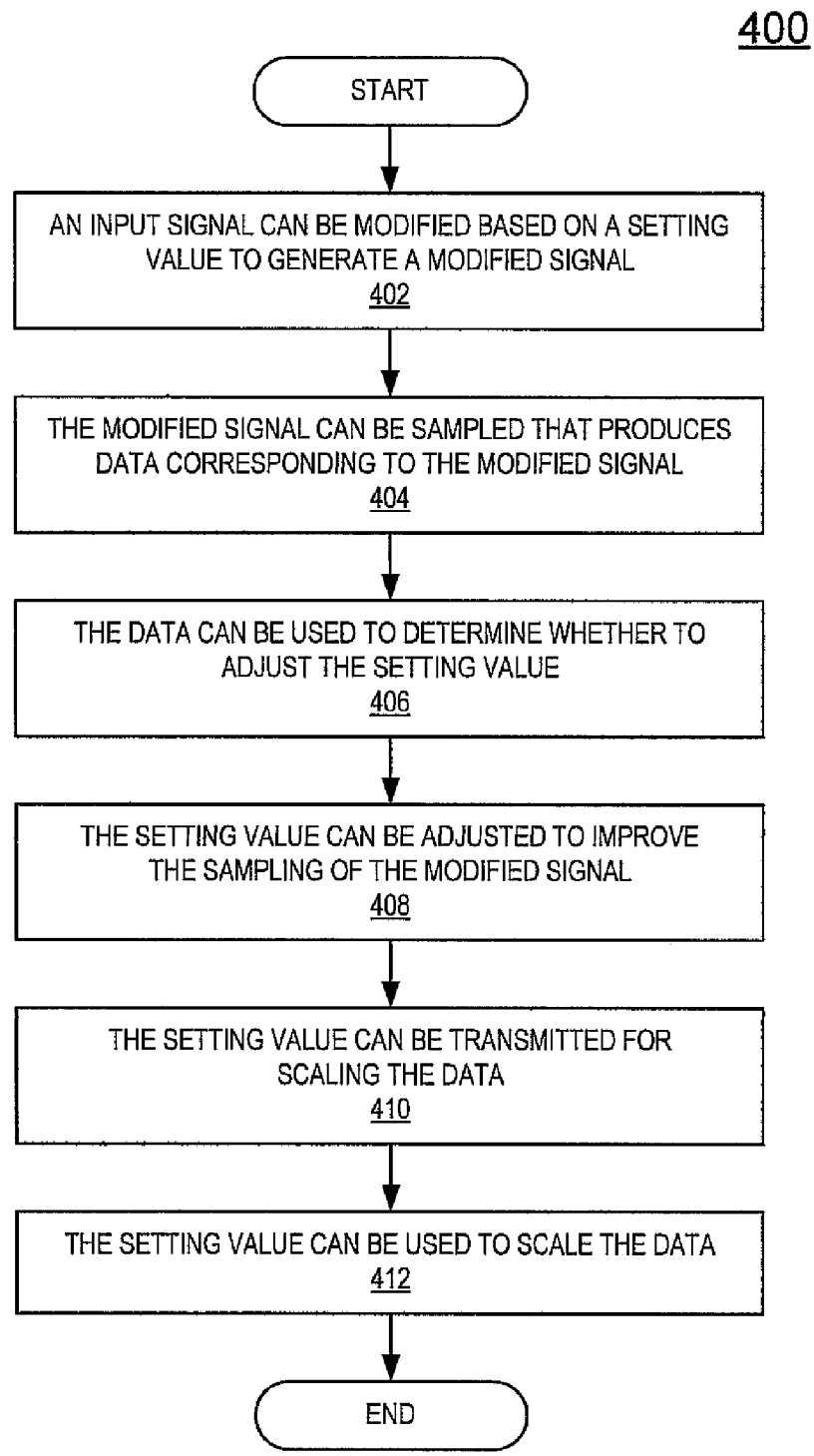
FIG. 4 is a flowchart of a method in accordance with embodiments of the invention.

FIG. 4 is a flowchart of a method 400 for measuring energy usage in accordance with embodiments of the invention. Method 400 includes exemplary processes of embodiments of the invention which can be carried out by a processor(s) and electrical components under the control of computing device readable and executable instructions (or code), e.g., software. The computing device readable and executable instructions (or code) may reside, for example, in data storage features such as volatile memory, non-volatile memory and/or mass data storage that are usable by a computing device. However, the computing device readable and executable instructions (or code) may reside in any type of computing device readable medium. Although specific operations are disclosed in method 400, such operations are exemplary. That is, method 400 may not include all of the operations illustrated by FIG. 4. Alternatively, method 400 may include various other operations and/or variations of the operations shown by FIG. 4. Likewise, the sequence of the operations of method 400 can be modified. It is noted that the operations of method 400 can each be performed by software, by firmware, by electronic hardware, or by any combination thereof.

Specifically, an input signal can be modified based on a setting value to generate a modified signal. The modified signal can be sampled that produces data corresponding to the modified signal. The data can be used to determine whether to adjust the setting value. The setting value can be adjusted to improve the sampling of the modified signal. The setting value can be transmitted for scaling the data. The setting value can be used to scale the data.

At operation 402 of FIG. 4, an input signal (e.g., 102) can be modified based on a setting value (e.g., 114) to generate a modified signal (e.g., 106). It is appreciated that the setting value can be implemented in a wide variety of ways. For example, the setting value can be implemented as a gain setting value, a unity gain setting, or an attenuation setting value, but is not limited to such. Understand that operation 402 can be implemented in a wide variety of ways. For example, operation 402 can be implemented in any manner similar to that described herein, but is not limited to such.

At operation 404, the modified signal (e.g., 106) can be sampled that produces data (e.g., 110) corresponding to the modified signal. It is noted that the data can be implemented in a wide variety of ways. For example, the data can include peak-to-peak voltage information associated with the modified signal, but is not limited to such. It is appreciated that operation 404 can be implemented in a wide variety of ways. For example, operation 404 can be implemented in any manner similar to that described herein, but is not limited to such.

At operation 406 of FIG. 4, the data (e.g., 110) can be used to determine whether to adjust the setting value (e.g., 114). Note that the data can be used at operation 406 in a wide variety of ways. For example, in one embodiment the data can be used by comparing the data to one or more threshold values. It is understood that operation 406 can be implemented in a wide variety of ways. For example, operation 406 can be implemented in any manner similar to that described herein, but is not limited to such.

At operation 408, the setting value (e.g., 114) can be adjusted to improve the sampling of the modified signal. It is appreciated that operation 408 can be implemented in a wide variety of ways. For example, operation 408 can be implemented in any manner similar to that described herein, but is not limited to such.

At operation 410 of FIG. 4, the setting value (e.g., 114) can be transmitted or output for scaling the data (e.g., 110). Understand that operation 410 can be implemented in a wide variety of ways. For example, operation 410 can be implemented in any manner similar to that described herein, but is not limited to such.

At operation 412, the setting value (e.g., 114) can be used to scale the data (e.g., 110). It is noted that operation 412 can be implemented in a wide variety of ways. For example, operation 412 can be implemented in any manner similar to that described herein, but is not limited to such. At the completion of operation 412, process 400 can be exited. It is understood that process 400 can exhibit the same advantages as those described herein with reference to the energy measurement apparatus 100 of FIG. 1, but is not limited to such.

The foregoing descriptions of specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. An apparatus comprising:
    an amplifier for amplifying an input signal and for generating a modified signal based upon said input signal;
    an analog-to-digital converter coupled to said amplifier, said analog-to-digital converter for sampling said modified signal and generating data corresponding to said modified signal;
    a scaling adjustment module coupled to said analog-to-digital converter, said scaling adjustment module for reducing a magnitude of said data and generating modified data; and
    a gain control module coupled to said analog-to-digital converter, wherein said apparatus is for measuring energy usage.

2. The apparatus of claim 1, wherein said gain control module is coupled to said scaling adjustment module, and wherein said gain control module is operable to determine a gain setting based upon said data received from said analog-to-digital converter.

3. The apparatus of claim 2, wherein said gain control module is operable to provide said gain setting to said scaling adjustment module.

4. The apparatus of claim 3, wherein said gain setting is used by said amplifier to generate said modified signal from said input signal.

5. The apparatus of claim 1, wherein said amplifier is coupled to said scaling adjustment module.

6. The apparatus of claim 4, wherein said amplifier provides a said gain setting to said scaling adjustment module.

7. The apparatus of claim 1, wherein said gain setting is selected to improve sampling of said modified signal by said analog-to-digital converter.

8. A method of measuring energy usage, said method comprising:
    modifying an input signal based on a setting value to generate a modified signal;
    sampling said modified signal and generating data corresponding to said modified signal;
    determining whether to adjust said setting value; and
    scaling said data based upon said setting value to generate modified data, wherein said scaling said data comprises reducing a magnitude of said data.

9. The method as described in claim 8, wherein said determining whether to adjust said setting value comprises comparing said data to a threshold value.

10. The method as described in claim 8, further comprising:
    adjusting said setting value to improve said sampling.

11. The method as described in claim 8, wherein said data comprises voltage peak-to-peak information associated with said modified signal.

12. The method as described in claim 8, wherein said setting value is a gain setting value.

13. The method as described in claim 8, wherein said setting value is an attenuation setting value.

14. The method as described in claim 8, further comprising:
    transmitting said setting value for use in performing said scaling.

15. A system comprising:
    means for modifying an input signal based on a setting value to generate a modified signal;
    means for sampling said modified signal and generating data corresponding to said modified signal;
    means for determining whether to adjust said setting value; and
    means for scaling said data based upon said setting value to generate modified data, wherein said scaling said data comprises reducing a magnitude of said data.

16. The system of claim 15, wherein said means for determining whether to adjust said setting value comprises means for comparing said data to a threshold value.

17. The system of claim 15 further comprising:
    means for adjusting said setting value to improve said sampling.

18. The system of claim 15, wherein said data comprises voltage peak-to-peak information associated with said modified signal.

19. The system of claim 15, wherein said setting value comprises a gain setting.

20. The system of claim 15, wherein said setting value comprises an attenuation setting.

* * * * *